United States Patent
Wong et al.

(10) Patent No.: US 9,978,844 B2
(45) Date of Patent: May 22, 2018

(54) HEMT-COMPATIBLE LATERAL RECTIFIER STRUCTURE

(71) Applicant: Taiwan Semiconductor Manufacturing Co., Ltd., Hsin-Chu (TW)

(72) Inventors: King-Yuen Wong, Tuen Mun (HK); Ming-Wei Tsai, Zhudong Township (TW); Han-Chin Chiu, Kaohsiung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days. days.

(21) Appl. No.: 14/583,391

(22) Filed: Dec. 26, 2014

(65) Prior Publication Data
US 2015/0123170 A1 May 7, 2015

Related U.S. Application Data

(63) Continuation-in-part of application No. 13/956,902, filed on Aug. 1, 2013, now Pat. No. 9,806,158.

(51) Int. Cl.
*H01L 29/20* (2006.01)
*H01L 29/66* (2006.01)
(Continued)

(52) U.S. Cl.
CPC .... *H01L 29/2003* (2013.01); *H01L 29/66462* (2013.01); *H01L 29/7787* (2013.01);
(Continued)

(58) Field of Classification Search
CPC ............. H01L 29/2003; H01L 29/7787; H01L 29/861; H01L 29/66462
(Continued)

(56) References Cited

U.S. PATENT DOCUMENTS

2003/0020092 A1* 1/2003 Parikh .................. H01L 29/518
257/192
2009/0032820 A1* 2/2009 Chen .................. H01L 29/7786
257/76
(Continued)

FOREIGN PATENT DOCUMENTS

CN 103578985 A 2/2014

OTHER PUBLICATIONS

U.S. Appl. No. 13/956,902, filed Aug. 1, 2013.
(Continued)

*Primary Examiner* — Ori Nadav
*Assistant Examiner* — Ernest Allen, III
(74) *Attorney, Agent, or Firm* — Eschweiler & Potashnik, LLC

(57) ABSTRACT

The present disclosure relates to a high electron mobility transistor compatible power lateral field-effect rectifier (L-FER) device. In some embodiments, the rectifier device has an electron supply layer located over a layer of semiconductor material at a position between an anode terminal and a cathode terminal. A layer of doped III-N semiconductor material is disposed over the electron supply layer. A passivation layer is located over the electron supply layer and the layer of doped III-N semiconductor material. A gate structure is disposed over the layer of doped III-N semiconductor material and the passivation layer. The layer of doped III-N semiconductor material modulates the threshold voltage of the rectifier device, while the passivation layer improves reliability of the L-FER device by mitigating current degradation due to high-temperature reverse bias (HTRB) stress.

20 Claims, 7 Drawing Sheets

(51) Int. Cl.
   *H01L 29/205* (2006.01)
   *H01L 29/778* (2006.01)
   *H01L 29/861* (2006.01)

(52) U.S. Cl.
   CPC .......... *H01L 29/861* (2013.01); *H01L 29/205* (2013.01); *H01L 29/66431* (2013.01); *H01L 29/778* (2013.01)

(58) Field of Classification Search
   USPC ........................................................ 257/620
   See application file for complete search history.

(56) References Cited

U.S. PATENT DOCUMENTS

| | | | | |
|---|---|---|---|---|
| 2009/0267078 | A1* | 10/2009 | Mishra | H01L 29/2003 257/76 |
| 2010/0019279 | A1* | 1/2010 | Chen | H01L 27/0605 257/194 |
| 2010/0314663 | A1 | 12/2010 | Ito et al. | |
| 2012/0217507 | A1* | 8/2012 | Ohki | H01L 29/7787 257/194 |
| 2012/0313106 | A1* | 12/2012 | He | H01L 29/1066 257/76 |
| 2013/0026495 | A1* | 1/2013 | Chu | H01L 29/2003 257/77 |
| 2013/0083567 | A1 | 4/2013 | Imada | |
| 2013/0087803 | A1* | 4/2013 | Kizilyalli | H01L 29/66462 257/76 |
| 2013/0256684 | A1 | 10/2013 | Nishimori et al. | |
| 2013/0313609 | A1* | 11/2013 | Akutsu | H01L 29/78 257/192 |
| 2014/0015066 | A1* | 1/2014 | Wu | H01L 29/2003 257/392 |
| 2014/0175453 | A1 | 6/2014 | Yamada | |
| 2014/0239309 | A1 | 8/2014 | Ramdani et al. | |
| 2014/0264365 | A1 | 9/2014 | Wong et al. | |

OTHER PUBLICATIONS

Final Office Action dated Nov. 10, 2015 U.S. Appl. No. 13/956,902.
Saadat, et al. "Gate-First AlGaN/GaN HEMT Technology for High-Frequency Applications", IEEE Electron Device Letters 30, 12, pp. 1254-1256, Dec. 2009.
Non Final Office Action dated May 11, 2015 U.S. Appl. No. 13/956,902.
Non-Final Office Action dated Jun. 17, 2016 for U.S. Appl. No. 13/956,902.
Final Office Action dated Apr. 13, 2017 in regards to U.S. Appl. No. 13/956,902.
Notice of Allowance dated Jun. 26, 2017 in connection with U.S. Appl. No. 13/956,902.

* cited by examiner

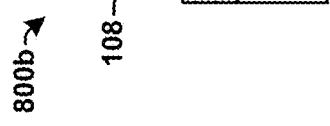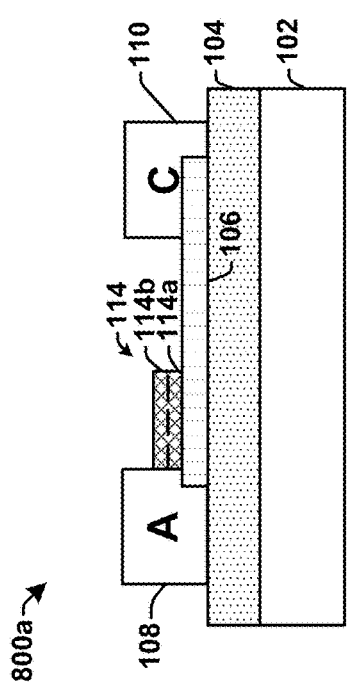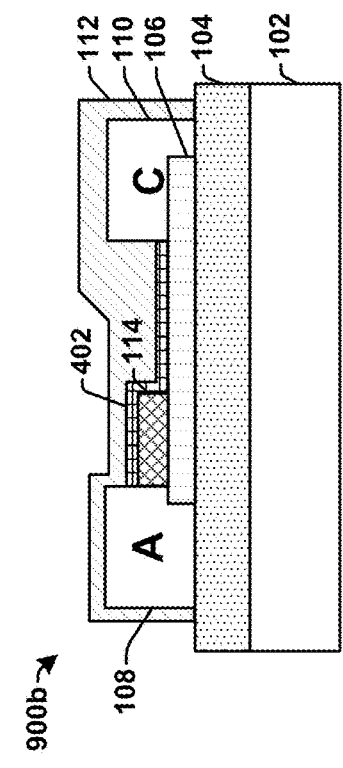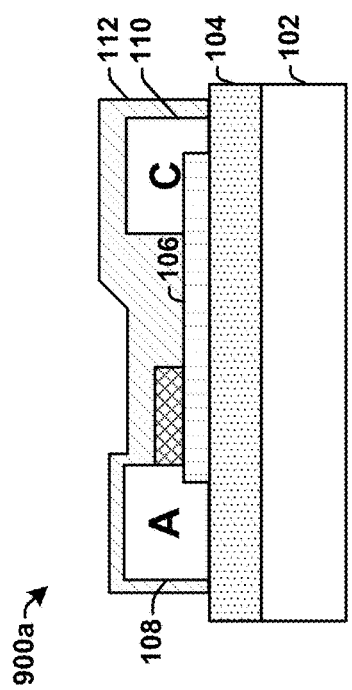

HEMT-COMPATIBLE LATERAL RECTIFIER STRUCTURE

CROSS REFERENCE TO RELATED APPLICATION

This application is a Continuation-In-Part of U.S. patent application Ser. No. 13/956,902 filed Aug. 1, 2013 entitled "HEMT-COMPATIBLE LATERAL RECTIFIER STRUCTURE."

BACKGROUND

A power semiconductor device is a semiconductor device used as a switch or rectifier in power electronics (e.g., power converters). In comparison to low-power MOSFET devices, power semiconductor devices (e.g., power diodes, thyristors, power MOSFETs, etc.) are configured to handle larger currents and to support larger reverse bias voltages.

Conventional power semiconductor devices are formed using silicon. However, in recent years the semiconductor industry has put significant effort into developing gallium nitride (GaN) based power devices. Compared to conventional silicon-based power devices, GaN-based power devices feature characteristics such as lower on-resistance and the ability to perform high-frequency operations.

BRIEF DESCRIPTION OF THE DRAWINGS

FIGS. 7-13b illustrate cross-sectional views of some embodiments of an example substrate upon which a method of forming a HEMT compatible lateral field effect rectifier (L-FER) device is performed.

DETAILED DESCRIPTION

Figure 1:
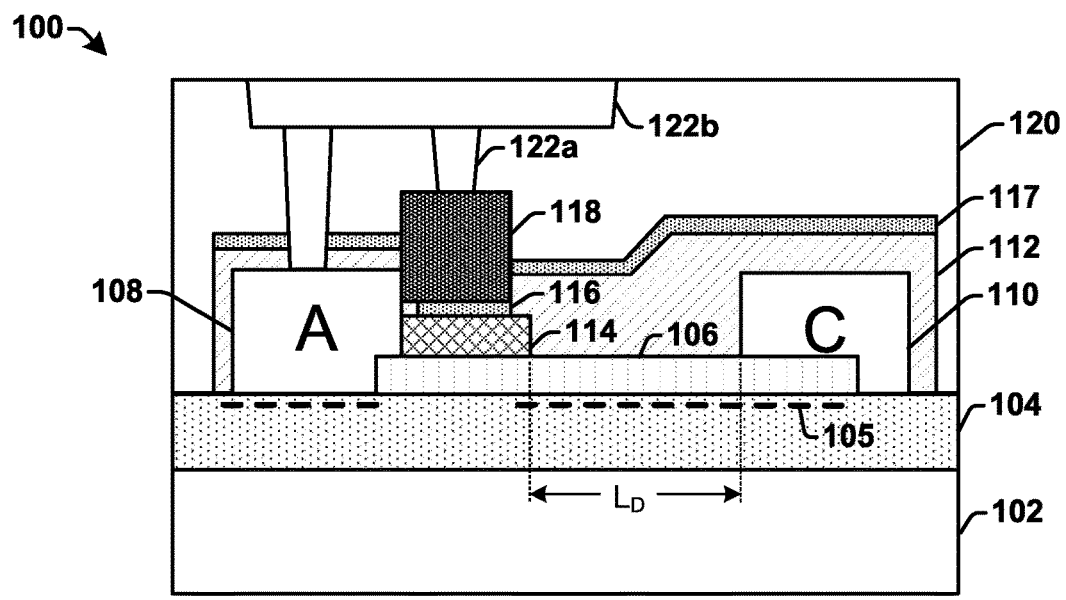
FIG. 1 illustrates a cross-sectional view of some embodiments of a high-electron mobility transistor (HEMT) compatible lateral field effect rectifier (L-FER) device

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one skilled in the art, that one or more aspects described herein may be practiced with a lesser degree of these specific details. In other instances, known structures and devices are shown in block diagram form to facilitate understanding.

In recent years, Gallium nitride (GaN) transistors have emerged as a promising alternative to silicon based transistors for many high power applications (e.g., power switches). GaN transistors, having aluminum gallium nitride/gallium nitride (AlGaN/GaN) heterostructures, offer a number of performance advantages over conventional silicon devices. For example, GaN semiconductors may provide a lower on-resistance and higher switching frequency than conventional silicon power devices.

Efforts have been made to provide for a two-terminal GaN power rectifier having good performance (e.g., a high reverse breakdown voltage, a low forward turn-on voltage, and a low specific on-resistance) that is compatible with a GaN HEMT (high electron mobility transistor). However, such efforts have largely failed. For example, the formation of Schottky barrier diodes and p-i-n diodes on a doped bulk GaN present high breakdown voltages and low-on resistance features, but the epitaxial structures of Schottky barrier diodes and p-i-n diodes are not compatible with the epitaxial structure of a GaN HEMT without significant performance loss (e.g., higher turn on voltages and on resistances). Alternatively, power rectifiers that are HEMT compatible have poor off leakage current, which is limited by Schottky contact reverse biasing leakage current.

Accordingly, the present disclosure relates to a high electron mobility transistor (HEMT)-compatible lateral field-effect rectifier device that provides for a high reverse breakdown voltage and low gate leakage. In some embodiments, the rectifier device comprises an electron supply layer located over a layer of semiconductor material at a position between an anode terminal and a cathode terminal. A layer of doped III-N semiconductor material is disposed over the electron supply layer. A layer of gate isolation material is located over the layer of doped III-N semiconductor material. A gate structure is disposed over gate isolation material, such that the gate structure is separated from the electron supply layer by the layer of gate isolation material and the layer of doped III-N semiconductor material. The layer of doped III-N semiconductor material modulates the threshold voltage of the rectifier device, while the layer of gate isolation material provides a barrier that provides the rectifier device with a low leakage and high reverse breakdown voltage.

FIG. 1 illustrates a cross-sectional view of some embodiments of a high-electron mobility transistor (HEMT) compatible lateral field effect rectifier (L-FER) device 100.

The L-FER device 100 comprises a layer of semiconductor material 104 disposed over a substrate 102 (e.g., a sapphire substrate, a silicon substrate, silicon carbide substrate, etc.). In some embodiments, the layer of semiconductor material 104 may comprise a III-V semiconductor material or a III-nitride (III-N) semiconductor material. For example, in some embodiments wherein the L-FER device 100 comprises a gallium nitride rectifier device, the layer of semiconductor material 104 may comprise a gallium nitride (GaN) layer (e.g., an unintentionally doped GaN layer having a doping resulting from process contaminants).

An electron supply layer 106 is located over the layer of semiconductor material 104 at a position that extends between anode and cathode terminals, 108 and 110, respectively comprising ohmic contact regions disposed over the layer of semiconductor material 104. The electron supply layer 106 comprises a material having a band gap unequal to (e.g., larger than) that of the underlying layer of semiconductor material 104 so that a heterojunction, which serves as a channel region of the HEMT compatible L-FER device 100, is located along an interface of the layer of semiconductor material 104 and electron supply layer 106. During operation, the heterojunction causes the electron supply layer 106 to supply charge carriers (e.g., electrons) to a two-dimensional electron gas (2-DEG) 105 formed along the interface. The 2-DEG 105 has high mobility electrons that are free to move between the anode terminal 108 and the cathode terminal 110. In some embodiments, the electron supply layer 106 comprises aluminum gallium nitride (AlGaN). In some embodiments, a thin film of AlGaN may be intentionally doped to have a doping that provides carriers to the 2-DEG 105.

A layer of insulating material 112 may be disposed over the anode terminal 108, the cathode terminal 110, and the electron supply layer 106. In some embodiments, the layer of insulating material 112 may comprise silicon nitride ($Si_3N_4$), for example. In some embodiments, the layer of insulating material 112 may be on and in direct contact with the anode terminal 108, the cathode terminal 110, and a portion of the electron supply layer 106.

A layer of doped III-N semiconductor material 114 is positioned over the electron supply layer 106. The layer of doped III-N semiconductor material 114 is laterally separated from the cathode terminal 110 by a drift length $L_D$. The layer of doped III-N semiconductor material 114 may comprise a p-type doping and/or an n-type doping in various embodiments. In some embodiments, the layer of doped III-N semiconductor material 114 is laterally disposed between the layer of insulating material 112 and the anode terminal 108. The layer of doped III-N semiconductor material comprises gallium-nitride (GaN). In some embodiments, the GaN may comprise a bottom layer of GaN having a first doping type (e.g., a p-type doping) and a top layer of GaN, overlying the bottom layer of GaN, having a second doping type (e.g., an n-type doping) different than the first doping type.

A layer of gate isolation material 116 is located over the layer of doped III-N semiconductor material 114. In some embodiments, the layer of gate isolation material 116 may comprise silicon dioxide ($SiO_2$), silicon nitride ($Si_3N_4$), gallium oxide ($Ga_2O_3$), aluminum oxide ($Al_2O_3$), scandium oxide ($Sc_2O_3$), hafnium oxide ($HfO_2$), or aluminum nitride (AlN), for example. In various embodiments, the layer of gate isolation material 116 may have a thickness in a range of between approximately 5 angstroms and approximately 30 angstroms. In some embodiments, a layer of isolation material 117 may be located over the layer of insulating material 112. The layer of isolation material 117 may be the same material as the layer of gate isolation material 116 and/or may have a same thickness as the layer of gate isolation material 116. The layer of gate isolation material 116 suppresses gate leakage current, thereby improving gate stability, providing the L-FER device 100 with a low turn-on voltage, a low on-resistance, and a high breakdown reverse voltage.

A gate structure 118 is located over the gate isolation material 116 at a position overlying the layer of doped III-N semiconductor material 114, such that the layer of gate isolation material 116 separates the gate structure 118 from the underlying doped III-N semiconductor material 114. In some embodiments, the gate structure 118 may comprise a metal gate structure. For example, the gate structure 118 may comprise one or more of titanium (Ti), nickel (Ni), aluminum (Al), nickel aluminum (NiAl), or tungsten (W), tungsten nitride (WN), or some combination thereof, for example. In various embodiments, the gate structure 118 may have a thickness (height) in a range of between approximately 1,000 angstroms and approximately 5,000 angstroms.

A dielectric material 120 is disposed over the substrate at a position overlying the gate structure 118. The dielectric material 120 may comprise a low-k inter-level dielectric (ILD) material such as silicon dioxide ($SiO_2$), silicon carbide doped oxide (SiCO), etc. The dielectric material 120 surrounds one or more metal interconnect layers 122 configured to provide an electrical connection to the anode terminal 108, the cathode terminal 110, and gate structure 118 of the L-FER device 100. In some embodiments, the one or more metal interconnect layers 122 may comprise one or more metal vias 122a configured to provide a vertical connection and one or more metal wires 122b configured to provide a lateral connection.

The one or more metal interconnect layers 122 are configured to electrically couple the gate structure 118 to the anode terminal 108. By connecting the gate structure 118 to the anode terminal 108, the three terminal device (the anode terminal 108, the cathode terminal 110 and the gate structure 118) is converted to a two terminal lateral rectifier having a drift length $L_D$, thereby allowing the forward turn-on voltage of the L-FER device 100 to be determined by the threshold voltage of the channel (rather than the Schottky barrier of the anode terminal 108). During operation, the one or more metal interconnect layers 122 may be operated to bias the L-FER device 100 in a forward bias mode of operation or in a reverse bias mode of operation. For example, applying a forward bias to the gate structure 118 causes the channel to turn on, while applying a reverse bias to the gate structure 118 causes the channel to turn off.

Figure 2:
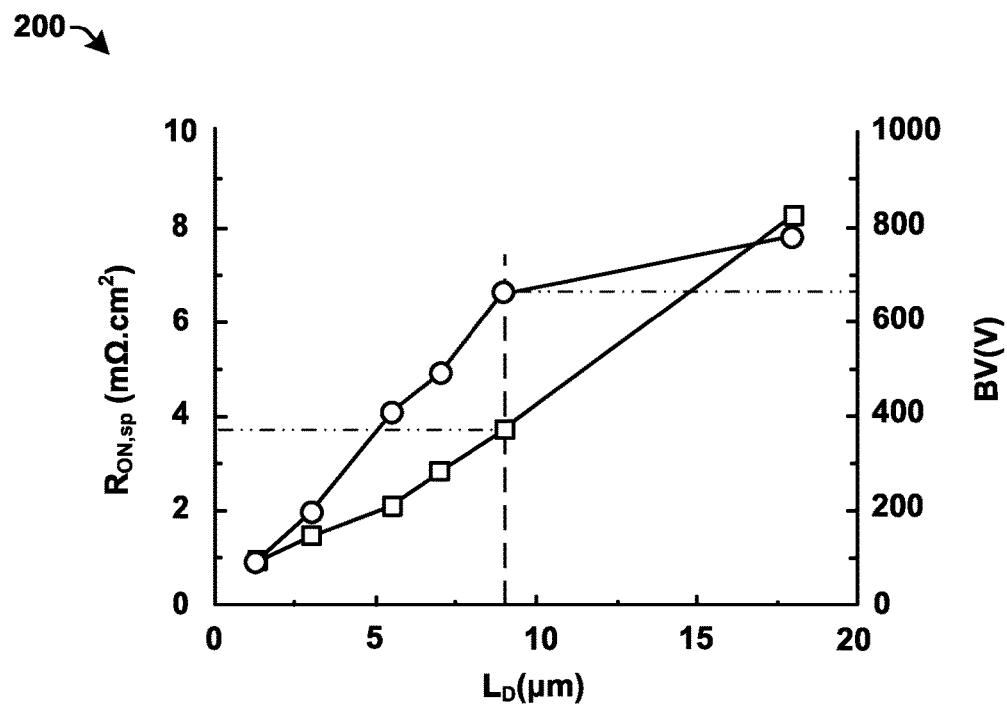
FIG. 2 illustrates a graph showing performance parameters of some embodiments of a disclosed HEMT compatible gallium-nitride (GaN) rectifier device.

FIG. 2 illustrates a graph 200 showing performance parameters of some embodiments of a disclosed HEMT compatible gallium-nitride (GaN) lateral rectifier device. A first y-axis illustrates the on-resistance (i.e., resistance drain to source) vs. the drift length $L_D$ (x-axis). A second y-axis illustrates the breakdown voltage vs. the draft length $L_D$ (x-axis).

As illustrated in graph 200, at a drift length $L_D$ of 9 um, the GaN lateral rectifier device exhibits a reverse breakdown voltage of 660 V and an on-resistance $R_{on,\ sp}$ of 3.72 mOhm*$cm^2$. The resulting power figure of merit ($BV^2/R_{on,sp}$) is 117 MW*$cm^{-2}$, which is comparable to state-of-art GaN rectifiers that are not compatible with HEMT.

Figure 3:
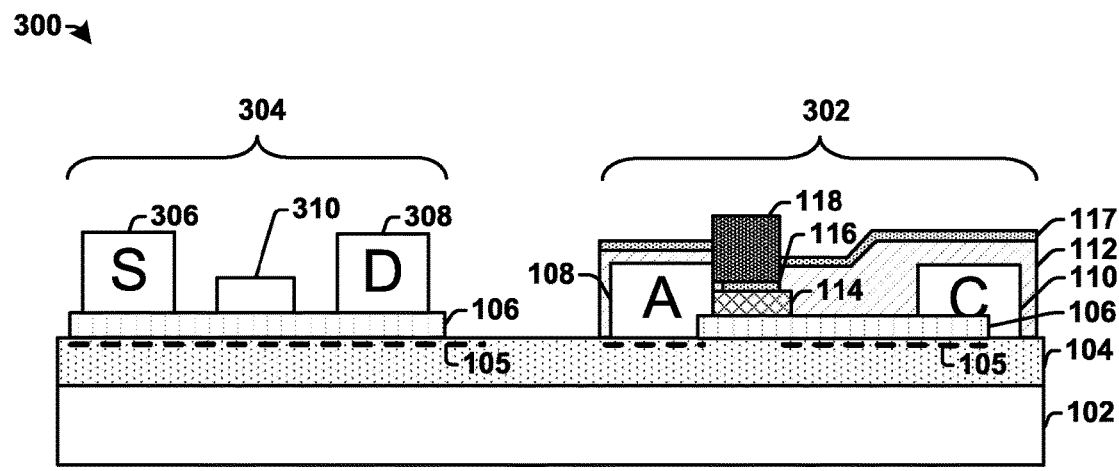
FIG. 3 illustrates a cross-sectional view of some embodiments of an integrated chip comprising a disclosed L-FER integrated with a normally-off HEMT.

FIG. 3 illustrates a cross-sectional view of some embodiments of an integrated chip 300 comprising a disclosed L-FER 302 integrated with a normally-off HEMT 304.

The L-FER 302 is described above in relation to FIG. 1. The normally off HEMT 304 comprises a source terminal 306, a drain terminal 308, and a gate structure 310, disposed over a heterojunction (e.g., an AlGaN/GaN heterojunction). As shown, the L-FER 302 and the normally-off HEMT 304 share a common epitaxial layer of semiconductor material 104 formed over substrate 102. In some embodiments, the L-FER 302 and the normally-off HEMT 304 may be manufactured as an integrated structure (e.g., on a same integrated chip) using a same fabrication process.

Figure 4:
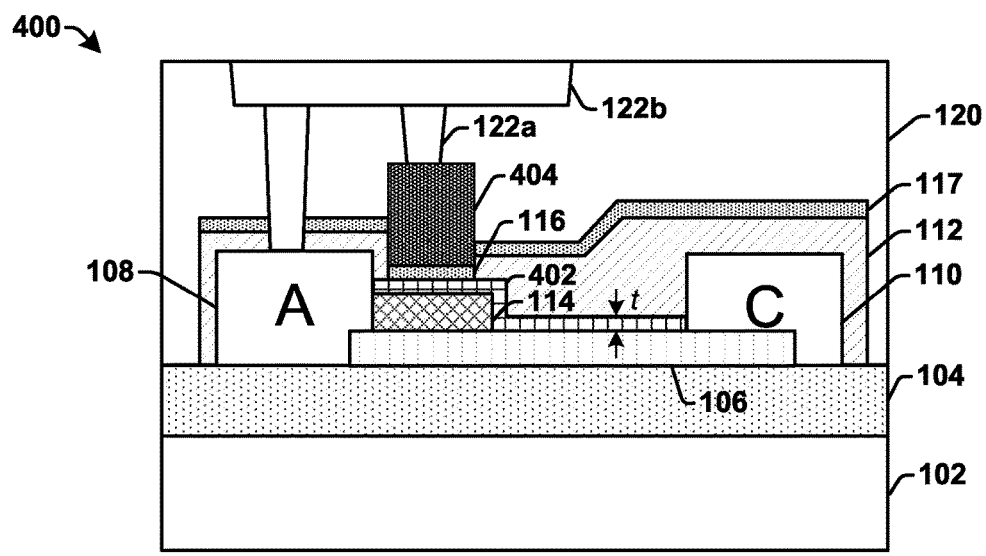
FIG. 4 illustrates a cross-sectional view of some embodiments of a HEMT compatible L-FER device with a passivation layer.

FIG. 4 illustrates a cross-sectional view of some embodiments of a high-electron mobility transistor (HEMT) compatible lateral field effect rectifier (L-FER) device 400 having a passivation layer 402.

HEMT compatible L-FER device 400 comprises a passivation layer 402 disposed over the electron supply layer 106 and a doped III-N semiconductor material 114. In some embodiments, the passivation layer 402 continuously extends from anode terminal 108 to cathode terminal 110. In some embodiments, the passivation layer 402 abuts a top surface of the electron supply layer 106, a top surface of the doped III-N semiconductor material 114, and a sidewall of the doped III-N semiconductor material 114. In some embodiments, the passivation layer 402 may also abut sidewalls of the anode terminal 108 and the cathode terminal 110.

The passivation layer 402 is configured to passivate surface traps and defects in the underlying electron supply layer 106 and doped III-N semiconductor material 114. By passivating surface traps and defects, the passivation layer 402 is able to increase device reliability and DC performance. For example, typically during high-temperature reverse bias (HTRB) stress surface traps and defects are activated, causing current degradation in the HEMT compatible L-FER device 400. The passivation layer 402 decreases current degradation caused by HTRB stress on the HEMT compatible L-FER device 400, so that the current before and after HTRB stress is substantially the same (i.e., the passivation layer 402 mitigates current degradation due to HTRB stress).

In some embodiments, the passivation layer 402 comprises a nitride based passivation layer. For example, in some embodiments, the passivation layer 402 may comprise aluminum nitride (AlN) or silicon nitride ($Si_3N_4$). The passivation layer 402 may have a thickness t that is in a range of between approximately 5 angstroms and approximately 100 angstroms, for example.

A layer of insulating material 112 is located over the passivation layer 402. An isolation material 117 is arranged onto the layer of insulating material 112 and a gate isolation material 116 is arranged onto the passivation layer 402. A gate structure 404 is disposed over the gate isolation material 116. In some embodiments, the gate structure 404 is disposed at a position that is laterally disposed between sections of the layer of insulating material 112. In some embodiments, the gate structure 404 may have a sidewall that is vertically aligned with a sidewall of the underlying gate isolation material 116 and that abuts the layer of insulating material 112 and the gate isolation material 116. In such embodiments, the passivation layer 402 may laterally extend past the gate structure 404. In some embodiments, the gate structure 404 is laterally separated from the anode terminal 108 by way of the layer of insulating material 112.

Figure 5:
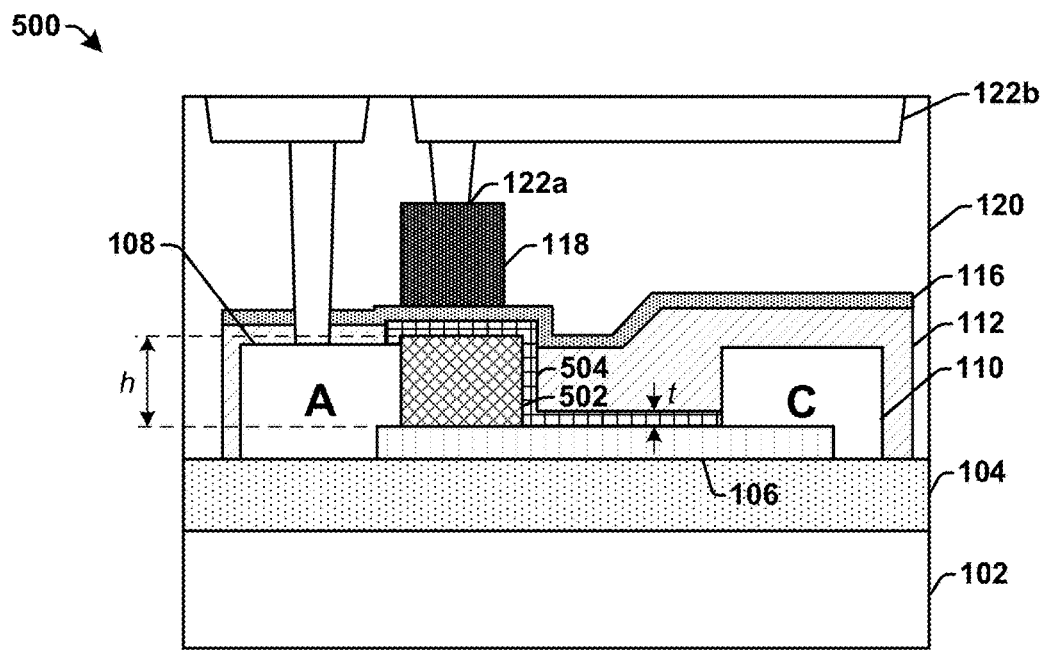
FIG. 5 illustrates a cross-sectional view of some alternative embodiments of a HEMT compatible L-FER device with a passivation layer.

FIG. 5 illustrates a cross-sectional view of some embodiments of a high-electron mobility transistor (HEMT) compatible lateral field effect rectifier (L-FER) device 500.

HEMT compatible L-FER device 500 shows a doped III-N semiconductor material 502 having a height h that causes the doped III-N semiconductor material 502 to extend to a position that is vertically above the anode terminal 108 to cathode terminal 110. It will be appreciated that the height of the doped III-N semiconductor material 502 tunes the threshold voltage of the L-FER device. As shown in HEMT compatible L-FER device 500, the height of the doped III-N semiconductor material 502 causes the passivation layer 504 to abut opposing sidewalls of the doped III-N semiconductor material 502.

Figure 6:
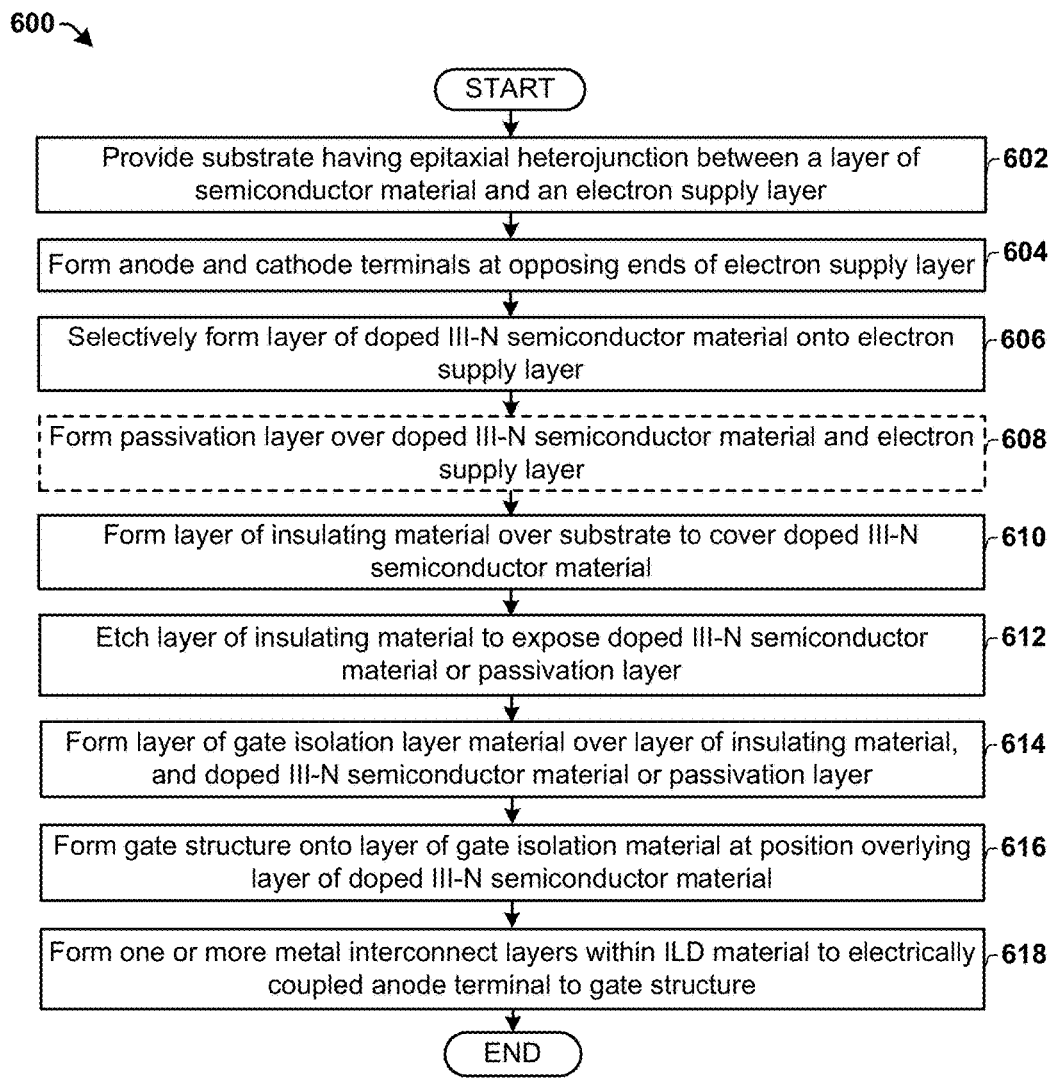
FIG. 6 illustrates a flow diagram of some embodiments of a method of forming a HEMT compatible L-FER device.

FIG. 6 illustrates a flow diagram of some embodiments of a method 600 for forming a HEMT compatible lateral field effect rectifier (L-FER) device.

While disclosed method 600 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 602, a substrate having an epitaxial heterojunction, between a layer of semiconductor material and an electron supply layer, is provided. In some embodiments, the substrate comprises a layer of semiconductor material (e.g., a III-V semiconductor material) and an overlying electron supply layer, epitaxial grown over a substrate (e.g., a sapphire substrate, a silicon substrate, silicon carbide substrate, etc.). The layer of semiconductor material and the electron supply layer have different bandgaps, resulting in the formation of the heterojunction.

At 604, an anode terminal and a cathode terminal are formed at opposing ends of the electron supply layer. The anode and cathode terminals comprise ohmic contact regions.

At 606, a layer of doped III-N semiconductor material is selectively formed onto the electron supply layer. In some embodiments, the layer of doped III-N semiconductor material may comprise a doped gallium nitride (GaN) material having a p-type doping and/or an n-type doping.

At 608, a passivation layer may be formed over the doped III-N semiconductor material and the electron supply layer, in some embodiments. In some embodiments, the passivation layer may be formed on and in direct contact with the layer of doped III-N semiconductor material and the electron supply layer.

At 610, a layer of insulating material is selectively formed over the substrate at a position overlying the anode terminal, the cathode terminal, the doped III-N semiconductor material, and/or the electron supply layer. In some embodiments, the layer of insulating material may be formed on and in direct contact with the passivation layer.

At 612, the layer of insulating material is selectively etched to expose the doped III-N semiconductor material or the passivation layer.

At 614, a layer of gate isolation material is formed over the layer of insulating material, and the layer of doped III-N semiconductor material or the passivation layer.

At 616, a gate structure is formed over the layer of gate isolation material at a position overlying the layer of doped III-N semiconductor material.

At 618, one or more metal interconnect layers are formed within an inter-level dielectric (ILD) material to electrically couple the anode terminal and the gate structure.

FIGS. 7-13b illustrate some embodiments of cross-sectional views of a substrate upon which a method forming a lateral field effect rectifier (L-FER) device, corresponding to method 600, is performed. Although FIGS. 7-13b are described in relation to method 600, it will be appreciated that the structures disclosed in FIGS. 7-13b are not limited to such a method, but instead may stand alone as a structure.

Figure 7:
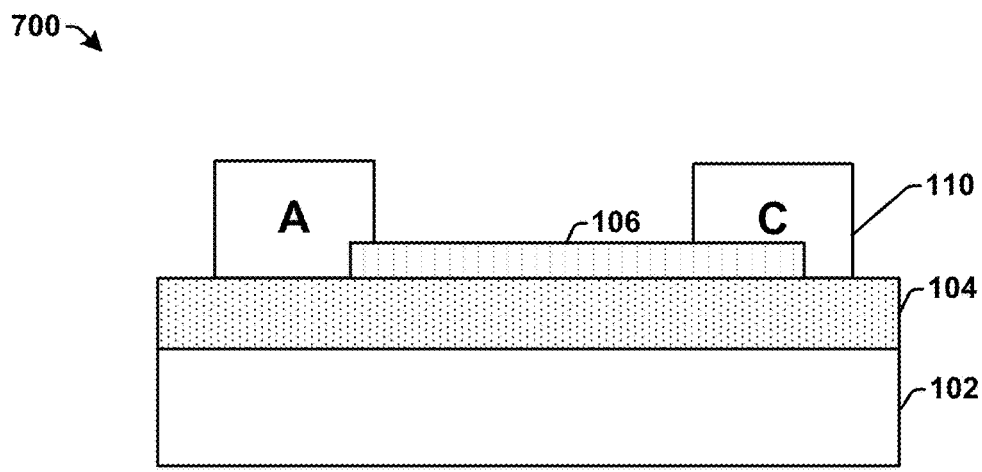

FIG. 7 illustrates a cross-sectional view 700 of some embodiments of a substrate corresponding to acts 602-604.

As shown in cross-sectional view 700, a layer of semiconductor material 104 and an electron supply layer 106 are epitaxially grown over a substrate 102 (e.g., silicon, silicon carbide, sapphire, etc.). The layer of semiconductor material 104 and the electron supply layer 106 have different bandgaps, thereby forming an epitaxial heterojunction. In some embodiments, the layer of semiconductor material 104 comprises a gallium-nitride (GaN) layer and the electron supply layer 106 comprises an aluminum gallium nitride (AlGaN) layer.

An anode terminal 108 and a cathode terminal 110 are formed at opposing ends of the electron supply layer 106. In some embodiments, the anode terminal 108 and the cathode terminal 110 may be formed by depositing a metal (e.g., tungsten, aluminum, etc.) onto the underlying layer of semiconductor material 104 by way of a deposition technique (e.g., chemical vapor deposition, physical vapor deposition, etc.) and selectively etching the deposited metal.

FIG. 8a illustrates a cross-sectional view 800a of some embodiments of a substrate corresponding to act 606.

As shown in cross-sectional view 800a, a layer of doped III-N semiconductor material 114 (e.g., GaN) is selectively formed onto the electron supply layer 106. In some embodiments, the layer of doped III-N semiconductor material 114 may comprise a layer of n/p gallium nitride (GaN). The layer of n/p GaN comprises a first layer of GaN 114a having a first doping type (e.g., an n-type doping) disposed onto the electron supply layer 106, and a second layer of GaN 114b having a second doping type (e.g., a p-type doping) disposed onto the first layer of GaN 114a. For example, the layer of n/p GaN may comprise a bottom first layer of GaN 114a having a p-type doping and an overlying top second layer of GaN 114b having an n-type doping. The layer of doped III-N semiconductor material 114 may have a thickness and doping that can be selected to have a value that tunes the threshold voltage of the L-FER device.

FIG. 8b illustrates a cross-sectional view 800b of some embodiments of a substrate corresponding to acts 606-608.

As shown in cross-sectional view 800b, a layer of doped III-N semiconductor material 114 (e.g., GaN) is selectively formed onto the electron supply layer 106. A passivation layer 402 is formed onto the doped III-N semiconductor material 114 and the electron supply layer 106. In some embodiments, the passivation layer 402 is formed at a position that abuts a top surface of the electron supply layer 106, a top surface of the doped III-N semiconductor material 114, and one or more sidewalls of the doped III-N semiconductor material 114. In some embodiments, the passivation layer 402 may continuously extend from anode terminal 108 to cathode terminal 110.

In various embodiments, the passivation layer 402 may be deposited by way of a deposition technique (e.g., atomic layer deposition (ALD), chemical vapor deposition (CVD), or physical vapor deposition (PVD), etc.) to a thickness that is in a range of between approximately 5 angstroms and approximately 100 angstroms, for example. In some embodiments, the passivation layer 402 may comprise a nitride based passivation layer. For example, the passivation layer 402 may comprise aluminum nitride (AlN) or silicon nitride ($Si_3N_4$).

FIGS. 9a-9b illustrate cross-sectional views, 900a and 900b, of some embodiments of a substrate corresponding to act 610.

As shown in cross-sectional view 900a, a layer of insulating material 112 is formed at a position overlying the anode terminal 108, the cathode terminal 110, and the electron supply layer 106. In some embodiments, the layer of insulating material 112 may comprise silicon nitride (SiN) deposited by a vapor deposition technique.

As shown in cross-sectional view 900b, the layer of insulating material 112 is formed at a position that is on and in direct contact with the anode terminal 108, the cathode terminal 110, and the passivation layer 402. In some embodiments, the passivation layer 402 and the layer of insulating material are different materials. For example, in some embodiments the passivation layer 402 may comprise SiN, while the layer of insulating material 112 may comprise AlN.

Figure 10A:
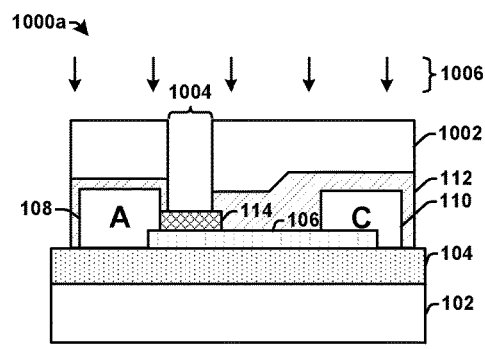
Figure 10B:
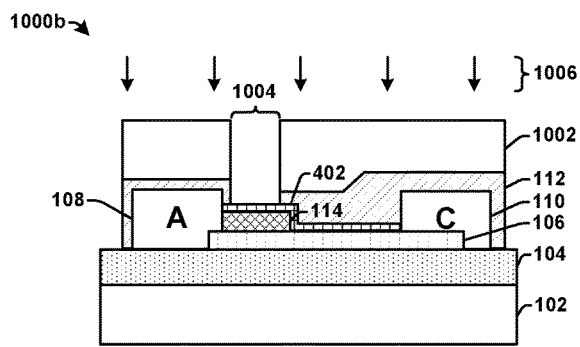

FIGS. 10a-10b illustrate cross-sectional views, 1000a and 1000b, of some embodiments of a substrate corresponding to act 612.

As shown in cross-sectional view 1000a, a masking layer 1002 is formed over the layer of insulating material 112. The masking layer 1002 comprises an opening 1004 at a position overlying the doped III-N semiconductor material 114 (e.g., a position in which a gate structure is to be subsequently formed). In some embodiments, the layer of insulating material 112 is selectively exposed to an etchant 1006 according to the masking layer 1002, to remove a portion of the layer of insulating material 112 and to thereby expose the underlying layer of doped III-N semiconductor material 114.

In some embodiments, the etchant 1006 may comprise a plasma etchant (e.g., an inductively coupled plasma reactive ion etchant in which high energy ions etch away the layer of insulating material 112). For example, the etchant 1006 may be generated by a RIE plasma dry etching process performed within a low pressure etching chamber.

As shown in cross-sectional view 1000b, the layer of insulating material 112 is selectively exposed to an etchant 1006, according to the masking layer 1002, to remove a portion of the layer of insulating material 112 and to thereby expose the underlying passivation layer 402.

Figure 11A:
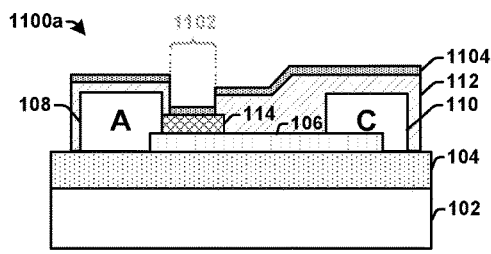
Figure 11B:
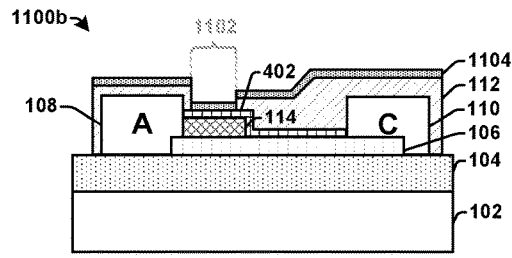

FIGS. 11a-11b illustrate cross-sectional views, 1100a and 1100b, of some embodiments of a substrate corresponding to act 614.

As shown in cross-sectional view 1100a, a layer of gate isolation material 1104 is formed over the layer of insulating material 112 and over the layer of doped III-N semiconductor material 114. In some embodiments, the layer of gate isolation material 1104 abuts the layer of doped III-N semiconductor material within an opening 1102 formed by selectively etching the insulating material 112 according to the masking layer 1002. The layer of gate isolation material 1104 provides a barrier between a subsequently formed gate structure (404) and the layer of doped III-N semiconductor material 114, thereby decreasing gate leakage. The layer of gate isolation material 1104 also prevents diffusion of atoms from the subsequently formed gate structure (404) to the underlying layer of doped III-N semiconductor material 114 during BEOL thermal processes used in formation of the one or more interconnect layers.

The layer of gate isolation material 1104 may be deposited by way of a vapor deposition process (e.g., ALD, CVD, PVD, etc.) to a thickness in a range of between approximately 5 angstroms and approximately 30 angstroms. In some embodiments, the layer of gate isolation material 1104 may comprise silicon dioxide ($SiO_2$), silicon nitride ($Si_3N_4$), gallium oxide ($Ga_2O_3$), aluminum oxide ($Al_2O_3$), Scandium oxide ($Sc_2O_3$), hafnium oxide ($HfO_2$), or aluminum nitride (AlN), for example.

As shown in cross-sectional view 1100b, the layer of gate isolation material 1104 is formed over the layer of insulating material 112 and over the passivation layer 402. In some embodiments, the layer of gate isolation material 1104 abuts the passivation layer 402 within an opening 1102 formed by selectively etching the insulating material 112 according to the masking layer 1002.

Figure 12A:
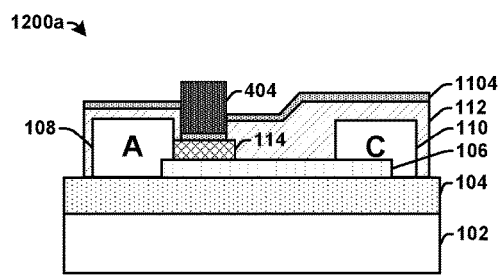
Figure 12B:
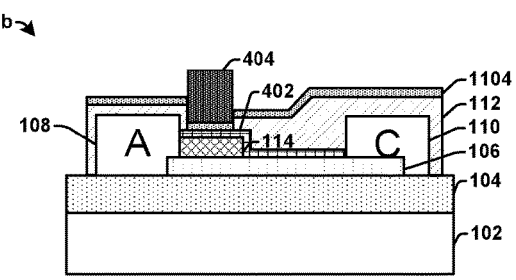

FIGS. 12a-12b illustrate cross-sectional views, 1200a and 1200b, of some embodiments of a substrate corresponding to act 616.

As shown in cross-sectional views 1200a and 1200b, a gate structure 118 is formed directly onto the layer of gate isolation material 1104. The gate structure 118 may be formed by depositing a metal (e.g., Ti, Ni, Al, NiAl, W, WN, etc.) using sputtering or physical vapor deposition, for example. The metal is then selectively etched to remove a part of the metal and to define a gate structure 118.

Figure 13A:
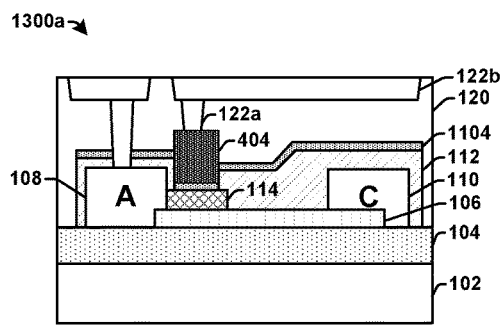
Figure 13B:
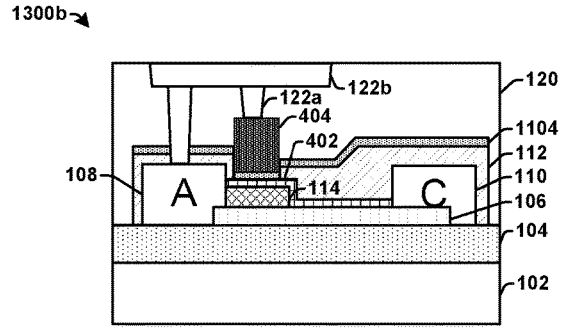

FIGS. 13a-13b illustrate cross-sectional views, 1300a and 1300b, of some embodiments of a substrate corresponding to act 618.

As shown in cross-sectional views 1300a and 1300b, one or more metal interconnect layers 122 are formed. The one or more metal interconnect layers 122 are configured to short the anode terminal 108 to the gate structure 118. By connecting the anode terminal 108 to the gate structure, the three terminal device is converted to a two terminal lateral rectifier.

In some embodiments, the one or more metal interconnect layers 122 may be formed by depositing a dielectric material 120 over the substrate and selectively etching the dielectric material 120 to form one or more trenches. The trenches are subsequently filled with a metal to form the one or more metal interconnect layers 122.

It will be appreciated that while reference is made throughout this document to exemplary structures in discussing aspects of methodologies described herein (e.g., the structure presented in FIGS. 7-13b, while discussing the methodology set forth in FIG. 6), that those methodologies are not to be limited by the corresponding structures presented. Rather, the methodologies (and structures) are to be considered independent of one another and able to stand alone and be practiced without regard to any of the particular aspects depicted in the Figs. Additionally, layers described herein, can be formed in any suitable manner, such as with spin on, sputtering, growth and/or deposition techniques, etc.

Also, equivalent alterations and/or modifications may occur to those skilled in the art based upon a reading and/or understanding of the specification and annexed drawings. The disclosure herein includes all such modifications and alterations and is generally not intended to be limited thereby. For example, although the figures provided herein, are illustrated and described to have a particular doping type, it will be appreciated that alternative doping types may be utilized as will be appreciated by one of ordinary skill in the art.

In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein The present disclosure relates to a high electron mobility transistor (HEMT)-compatible power lateral field-effect rectifier (L-FER) device that provides for a high-mobility and low gate leakage.

In some embodiments, the present disclosure relates to a high electron mobility transistor (HEMT)-compatible power lateral field-effect rectifier (L-FER) device. The L-FER device comprises a layer of semiconductor material disposed over a substrate, and an electron supply layer disposed over the layer of semiconductor material at a position between an anode terminal and a cathode terminal. A layer of doped III-N (III-nitride) semiconductor material is disposed over the electron supply layer, and a passivation layer is disposed over the electron supply layer and the layer of doped III-N semiconductor material. A gate structure is disposed at a position vertically overlying the layer of doped III-N semiconductor material and the passivation layer.

In other embodiments, the present disclosure relates to a lateral field-effect rectifier (L-FER) device. The L-FER device comprises a layer of semiconductor material disposed over a substrate, and an electron supply layer disposed over the layer of semiconductor material at a position laterally arranged between an anode terminal and a cathode terminal. A layer of doped III-N (III-nitride) semiconductor material is disposed over the electron supply layer, and a nitride based passivation layer is disposed on and in direct contact with the layer of doped III-N semiconductor material and the electron supply layer. A layer of gate isolation material is disposed over the passivation layer at a position overlying the layer of doped III-N semiconductor material, and a gate structure is disposed over the layer of gate isolation material.

In yet other embodiments, the present disclosure relates to a method of forming a lateral field effect rectifier (L-FER) device. The method comprises providing a substrate having an epitaxial heterojunction between a layer of semiconductor material and an electron supply layer, and forming an anode terminal and a cathode terminal comprising ohmic contact regions at opposing ends of the electron supply layer. The method further comprises selectively forming a layer of doped III-N (III-nitride) semiconductor material is onto electron supply layer. The method further comprises forming a passivation layer over the electron supply layer and the doped III-N semiconductor material. The method further comprises forming a gate structure at a position overlying the layer of doped III-N semiconductor material.

What is claimed is:
1. A high electron mobility transistor (HEMT)-compatible power lateral field-effect rectifier (L-FER) device, comprising:
   a layer of semiconductor material disposed over a substrate;
   an electron supply layer disposed over the layer of semiconductor material at a position between an anode terminal and a cathode terminal, wherein the anode terminal and the cathode terminal respectively comprise a vertically extending surface abutting a sidewall of the electron supply layer and a horizontally extending surface abutting an upper surface of the electron supply layer, wherein the electron supply layer horizontally extends a first lateral distance directly below the anode terminal and a second lateral distance directly below the cathode terminal, and wherein the first lateral distance is less than the second lateral distance;
   a layer of doped III-N (III-nitride) semiconductor material disposed over the electron supply layer;
   a passivation layer disposed on and in contact with the upper surface of the electron supply layer and in contact with an upper surface and sidewall of the layer of doped III-N semiconductor material; and
   a gate structure disposed over the layer of doped III-N semiconductor material and the passivation layer, wherein the passivation layer separates the gate structure from the layer of doped III-N semiconductor material so that the gate structure does not contact the layer of doped III-N semiconductor material.

2. The L-FER device of claim 1, further comprising:
a layer of insulating material arranged in contact with upper surfaces of the passivation layer and the layer of semiconductor material;
a layer of gate isolation material vertically disposed between the passivation layer and the gate structure and arranged on and in contact with a top surface of the layer of insulating material and having a non-planar upper surface facing away from the substrate; and
an ILD layer arranged on and in direct contact with top surfaces of the layer of gate isolation material and the gate structure.

3. The L-FER device of claim 2, wherein the layer of gate isolation material abuts the passivation layer at a position overlying the layer of doped III-N semiconductor material.

4. The L-FER device of claim 1, wherein the passivation layer continuously extends from the anode terminal to the cathode terminal.

5. The L-FER device of claim 1, wherein the passivation layer comprises aluminum nitride (AlN) or silicon nitride ($Si_3N_4$).

6. The L-FER device of claim 1, wherein the passivation layer has thickness in range of between approximately 5 angstroms and approximately 100 angstroms.

7. The L-FER device of claim 1, further comprising:
a layer of insulating material arranged on and in contact with an upper surface of the passivation layer and laterally separated from the layer of doped III-N semiconductor material by the passivation layer.

8. A lateral field-effect rectifier (L-FER) device, comprising:
a layer of semiconductor material disposed over a substrate;
an electron supply layer disposed over the layer of semiconductor material at a position laterally arranged between an anode terminal and a cathode terminal, wherein the anode terminal and the cathode terminal respectively comprise an 'L' shaped region that directly overlaps the electron supply layer vertically and horizontally, wherein the electron supply layer horizontally extends a first lateral distance directly below the anode terminal and a second lateral distance directly below the cathode terminal, and wherein the first lateral distance is different than the second lateral distance;
a layer of doped III-N (III-nitride) semiconductor material disposed over the electron supply layer;
a nitride based passivation layer disposed over the layer of doped III-N semiconductor material and the electron supply layer;
a layer of insulating material arranged on and in contact with a first upper surface of the passivation layer;
a layer of gate isolation material disposed on and in contact with a second upper surface of the passivation layer at a position overlying the layer of doped III-N semiconductor material, wherein the layer of gate isolation material is arranged on and in contact with an upper surface of the layer of insulating material; and
a gate structure disposed over the layer of gate isolation material.

9. The L-FER device of claim 8, wherein the layer of insulating material is disposed on and in contact with upper surfaces of the passivation layer, the anode terminal, and the cathode terminal and a sidewall of the passivation layer.

10. The L-FER device of claim 8, wherein the passivation layer comprises aluminum nitride (AlN) or silicon nitride ($Si_3N_4$).

11. A lateral field-effect rectifier (L-FER) device, comprising:
a layer of semiconductor material disposed over a substrate;
an electron supply layer vertically disposed over the layer of semiconductor material and laterally confined between sidewalls of an anode terminal and a cathode terminal, wherein the sidewalls of the anode terminal and the cathode terminal contact sidewalls of the electron supply layer and lower surfaces of the anode terminal and the cathode terminal contact an upper surface of the electron supply layer, wherein the electron supply layer horizontally extends a first lateral distance directly below the anode terminal and a second lateral distance directly below the cathode terminal, and wherein the first lateral distance is different than the second lateral distance;
a layer of doped III-N (III-nitride) semiconductor material disposed over the electron supply layer;
a passivation layer disposed over the electron supply layer and the layer of doped III-N semiconductor material;
a layer of insulating material arranged over the passivation layer and contacting upper surfaces of the passivation layer, the anode terminal, and the cathode terminal and contacting a sidewall of the passivation layer; and
a gate structure disposed at a position vertically overlying the layer of doped III-N semiconductor material and the passivation layer.

12. The L-FER device of claim 11, wherein a part of the layer of insulating material overlying the electron supply layer is also laterally separated from the layer of doped III-N semiconductor material by the passivation layer.

13. The L-FER device of claim 11, wherein the passivation layer directly contacts upper surfaces of the electron supply layer and the layer of doped III-N semiconductor material facing away from the substrate.

14. The L-FER device of claim 7, further comprising:
a layer of gate isolation material arranged onto the passivation layer and the layer of insulating material, wherein the layer of gate isolation material is arranged between the passivation layer and the gate structure.

15. The L-FER device of claim 9, wherein the layer of gate isolation material extends from between the nitride based passivation layer and the gate structure to over the layer of insulating material.

16. The L-FER device of claim 1,
wherein the passivation layer extends to a first height over the electron supply layer at a first location under the gate structure; and
wherein the passivation layer extends to a second height over the electron supply layer, which is less than the first height, at a second location laterally between the gate structure and the cathode terminal.

17. The L-FER device of claim 8, wherein the layer of gate isolation material is laterally separated from the cathode terminal or the anode terminal by a non-zero space.

18. The L-FER device of claim 8, wherein the gate structure laterally contacts the layer of insulating material.

19. The L-FER device of claim 8, wherein the first upper surface of the nitride based passivation layer laterally extends from a first outermost sidewall to an interior sidewall and the second upper surface of the nitride based passivation layer laterally extends from a second outermost sidewall to the interior sidewall, wherein the first upper surface is separated from the substrate by a different distance than the second upper surface.

20. The L-FER device of claim 8, wherein the layer of doped III-N semiconductor material laterally contacts the anode terminal.

* * * * *